(12) United States Patent
Colburn et al.

(10) Patent No.: US 8,358,011 B1
(45) Date of Patent: Jan. 22, 2013

(54) INTERCONNECT STRUCTURES WITH ENGINEERED DIELECTRICS WITH NANOCOLUMNAR POROSITY

(75) Inventors: Matthew E. Colburn, Hopewell Junction, NY (US); Satya V. Nitta, Poughquag, NY (US); Sampath Purushothaman, Yorktown Heights, NC (US); Charles Black, New York, NY (US); Kathryn Guarini, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 1263 days.

(21) Appl. No.: 11/899,842

(22) Filed: Sep. 7, 2007

(51) Int. Cl.
  *H01L 23/48* (2006.01)
(52) U.S. Cl. ........ 257/774; 257/211; 257/701; 257/758; 257/760

(58) Field of Classification Search .................. 257/774, 257/758, 760, 701, 211
See application file for complete search history.

(56) References Cited

U.S. PATENT DOCUMENTS

| | | | | |
|---|---|---|---|---|
| 5,869,880 | A * | 2/1999 | Grill et al. | 257/522 |
| 6,297,150 | B1 * | 10/2001 | Morinaga | 438/637 |
| 6,924,240 | B2 * | 8/2005 | Nobutoki et al. | 438/783 |

* cited by examiner

*Primary Examiner* — Tan N Tran
(74) *Attorney, Agent, or Firm* — Thomas A. Beck; Daniel P. Morris

(57) ABSTRACT

A method for forming an interconnect structure with nanocolumnar intermetal dielectric is described involving the construction of an interconnect structure using a solid dielectric, and introducing a regular array of vertically aligned nanoscale pores through stencil formation and etching to form a hole array and subsequently pinching off the tops of the hole array with a cap dielectric. Variations of the method and means to construct a multilevel nanocolumnar interconnect structure are also described.

1 Claim, 9 Drawing Sheets

INTERCONNECT STRUCTURES WITH ENGINEERED DIELECTRICS WITH NANOCOLUMNAR POROSITY

BACKGROUND OF THE INVENTION

1. Technical Field of the Invention

The present invention relates generally to very high performance microelectronic chips used in computers, microprocessors, microcontrollers, sensors, communication devices and the like. In particular, the invention relates to the interconnect wiring networks on such chips, with the goal of significantly reducing the signal propagation delay associated with these wires in the networks using copper wiring embedded in a very low k dielectric medium possessing engineered porosity formed after the interconnects are formed.

2. Description of the Background Art

High performance microprocessor, microcontroller and communication chips require very high speed interconnects between the active transistor devices which are used to perform the various functions such as logical operations, storing and retrieving data, providing control signals and the like. With the progress in the transistor device technology leading to the present ultra large scale integration, the overall speed of operation of these advanced chips are beginning to be limited by the signal propagation delay in the interconnection wires between the individual devices on the chips. The signal propagation delay in the interconnects is dependent on the RC product wherein, R denotes the resistance of the interconnect wires and C represents the overall capacitance of the interconnect scheme in which the wires are embedded. Use of copper instead of Al as the interconnect wiring material has allowed the reduction of the resistance contribution to the RC product.

The current focus in the microelectronics industry is to reduce interconnect capacitance by the use of lower dielectric constant (k) insulators in building the multilayered interconnect structures on chips.

One prior art method of creating interconnect wiring network on such small a scale is the dual damascene (DD) process schematically shown in FIG. 1. In the standard DD process, an inter metal dielectric (IMD), shown as two layers 1110, 1120 is coated on substrate 1100 as depicted in FIG. 1*a*. The via level dielectric 1110 and the line level dielectric 1120 are shown separately for clarity of the process flow description.

In general, these two layers can be made of the same or different insulating films and in the former case applied as a single monolithic layer. A hard mask layer or a layered stack 1130 is optionally employed to facilitate reactive ion etch selectivity and to serve as a polish stop. The wiring interconnect network consists of two types of features: line features that traverse a distance across the chip, and the via features which connect lines in different levels of interconnects in a multilevel stack together. Historically, both layers are made from an inorganic glass like silicon dioxide ($SiO_2$) or a fluorinated silica glass (FSG) film deposited by plasma enhanced chemical vapor deposition (PECVD).

In the dual damascene process, the position of the lines 1150 and the vias 1170 are defined lithographically in photoresist layers 1500 and 1510 respectively, FIGS. 1*b* and 1*c*, and transferred into the hard mask and IMD layers using reactive ion-etching processes. The process sequence shown in FIG. 1 is called a "line-first" approach.

After the trench formation, lithography is used to define a via pattern 1170 in the photoresist layer 1510 and the pattern is transferred into the dielectric material to generate a via opening 1180, FIG. 1*d*.

The dual damascene trench and via structure 1190 is shown in FIG. 1*e* after the photoresist has been stripped. This recessed structure 1190 is then coated with a conducting liner material or material stack 1200 that serves to protect the conductor metal lines and vias and serves as an adhesion layer between the conductor and the IMD. This recess is then filled with a conducting fill material 1210 over the surface of the patterned substrate. The fill is most commonly accomplished by electroplating of copper although other methods such as chemical vapor deposition (CVD) and other materials such as Al or Au can also be used. The fill and liner materials are then chemical-mechanical polished (CMP) to be coplanar with the surface of the hard mask and the structure at this stage is shown in FIG. 1*f*.

A capping material 1220 is deposited as a blanket film, as is depicted in FIG. 1*g* to passivate the exposed metal surface and to serve as a diffusion barrier between the metal and any additional IMD layers to be deposited over them. Silicon nitride, silicon carbide, and silicon carbonitride films deposited by PECVD are typically used as the capping material 1220. This process sequence is repeated for each level of the interconnects on the device. Since two interconnect features are simultaneously defined to form a conductor in-laid within an insulator by a single polish step, this process is designated a dual damascene process.

In order to lower the capacitance, it is necessary to use lower k dielectrics such as organic polymers and spin on organo-silicate glasses which have k values in the 2.5 to 3.0 range instead of the PECVD silicon dioxide based dielectrics (k=3.6 to 4.0). The k value can be further reduced to 2.2 (ultra low k) and even below 2.0 (extreme low k) by introduction of porosity in these insulators. The minimum value of the dielectric constant is 1.0. For the purpose of brevity, we shall refer to these ultra low k and extreme low k materials collectively as very low k materials (i.e., in the range of about 2.2 and below) in this document.

Although a tunable range of k values is possible with this set of very low k materials, there are several difficulties in integrating these materials with copper interconnects by the dual damascene process described above.

These low k dielectrics have a much lower elastic modulus, fracture toughness and cohesive strength than the silicon dioxide or FSG films and their adhesion to typical hard mask layers used in current state of the art copper interconnect is also correspondingly inferior. As a result, when the CMP of the copper fill is attempted during the dual damascene interconnect build, delamination occurs either cohesively in the weak low k material or adhesively at the interface between the very low k material and the hard mask. This renders the DD process highly impractical from the point of view of manufacturability and yields.

There are other issues associated with integrating very low k porous dielectrics with interconnected porosity that pertain to the metallization and plating of wiring layers.

In particular, deposition of barrier layers such as tantalum, tantalum nitride, tantalum silicon nitride, titanium silicon nitride, tungsten and tungsten nitride and the like by chemical vapor deposition or atomic layer deposition can lead to the penetration of the gaseous precursors used into the pores resulting in the deposition of the conductive barriers in these pores. This in turn can lead to line to line shorting. Poor coverage of the rough surfaces of the porous dielectric surfaces by these barriers can also lead to infiltration of the plating and cleaning solutions into the dielectric. Poor coverage can also lead to Cu diffusion into the dielectric during subsequent thermal processing cycles which can cause a degradation in the electrical breakdown behavior of the intermetal dielectric (IMD).

One prior art method to overcome some of these difficulties is described in assignee's U.S. Pat. No. 6,451,712 (Dalton et al.), the contents of which are hereby incorporated by reference herein.

In this method, the pore generating component (known as porogen) used in the porous dielectric formulation is retained in the dielectric film during the dual damascene patterning, barrier/liner deposition, plating and CMP so that these steps are performed in a nonporous dielectric. Subsequent to the CMP step, the porogen is removed from the dielectric by a thermal anneal rendering the dielectric porous. This method requires that the hard mask used in the DD fabrication be not only a good CMP stop layer but also be permeable to the porogen species during the thermal anneal step. Further, it is required that the dielectric be able to release the porogen without significant shrinkage so that dimensional changes or thermal stresses in the interconnect is avoided. These requirements are often conflicting in nature and are restrictive of the extent of porosity that can be generated and hence the lowering of the dielectric constant of the IMD. The pores formed are in general randomly oriented and have a range of sizes. Such a porous structure is generally weaker in mechanical strength and sometimes exhibits spatial variability in the dielectric properties as a result of the pore size distribution.

A second prior art method described in a copending patent application Ser. No. 10/280,283 circumvents the issues of porous IMD integration by building the interconnects by a dual damascene process in a support dielectric, etching out the said support dielectric form between the lines only, filling the etched out gaps with a porous low k dielectric and polishing back to planaraize the top of the interconnects.

While this prior art method does avoid all the issues associated the direct DD integration of the porous IMDs, it requires that the porous IMD be able to fill line to line gaps and withstand CMP planarization which can restrict the choices of the porous IMD. Further, additional process steps to etch the support dielectric and fill and polish the gapfill porous dielectric are needed which can add to manufacturing cost and lead to possible reduction in yield.

It is therefore an object of this invention to produce an interconnect structure with very low effective dielectric constant (hereinafter "keff") by avoiding the above described issues associated with porous dielectrics and the prior art methods of forming integrated structures using them.

It is further an object of this invention to overcome these difficulties, by performing all the steps required for interconnect fabrication using a dielectric without any porosity (robust enough to withstand state-of-the-art semiconductor interconnect fabrication techniques) and introducing nanoscale porosity with controlled size and orientation into it after the dual damascene interconnect structure is formed.

SUMMARY OF THE INVENTION

This invention pertains to the very high performance microelectronic chips used in computers, microprocessors, microcontrollers, sensors, communication devices and the like. In particular, the inventive structures described herein pertain to the interconnect wiring networks on such chips, with the goal of significantly reducing the signal propagation delay associated with these wires. The inventive methods detailed and claimed provide the integration steps required to fabricate these high performance interconnect networks with copper wiring embedded in a very low k dielectric medium comprising engineered porosity characterized by a specific pore orientation, size and spacing forming a regular array of pores; further, the engineered porosity is formed after the interconnects are formed.

The interconnect structure of the present invention used for the purposes set forth above embodies a first dielectric material encasing a set of conductive vias and supporting thereon a set of conductive lines on its top surface. There is, in addition, a second dielectric disposed between the set of conducting lines and possessing a top surface and a bottom surface. The second dielectric contains a regular array of nanocolumnar pores which are sealed off at the top by a layer of a third dielectric layer which serves to protect the top surface of the conductive lines. Specific copolymers are used as templates or stencils to obtain the "regular array" in accordance with the present invention. The expression "regular array" is used herein to designate an ordered arrangement of separated phases, such as in a hexagonal closed pack pattern. For the purpose of this disclosure, "nanocolumnar" describes a structure generated from the regular array noted above, which is transferred anisotropically into an underlying material stack which can include one or more of the layers selected from the group comprising: hardmask, cmp stop, etch stop, line-level dielectric and via level dielectric. The invention generally relates to generating nanocolumnar voids or nanocolumnar pillars in a dielectric stack in order to reduce the effective dielectric constant of the interconnect structure.

These and other aspects of the present inventive method are illustrated in the figures listed below and described in greater detail in the following section.

DETAILED DESCRIPTION OF THE INVENTION

The inventive method taught is described as the "Nanocolumnar Dielectric" integration scheme. Different embodiments of this general inventive method and the resulting structures are described in detail below.

The method of the first embodiment begins with the fabrication of a dual damascene interconnect structure comprising the prior art steps described earlier and depicted in the steps FIG. 1$a$ through FIG. 1$f$ resulting in embedded Cu lines coplanar with the IMD surface. The DD structure is built using IMD materials, which are preferably more robust compared with the very low k dielectrics described in the prior art. Such a robust IMD material can be selected from, but not restricted to, the set comprising (a) organic thermoset dielectrics such as polyarylene ethers (for example SiLK™ produced by Dow Chemical Company or GX3™ produced by Honeywell Microelectronic Materials) (b) spun on silica or organosilicate glass films, (c) hydrogenated amorphous dielectrics comprising Si, C, H and O and deposited by plasma enhanced chemical vapor deposition (PECVD), (d) undoped silicon oxide glass (USG) and fluorine doped silicon oxide glass (FSG) deposited by PECVD, (e) porous versions of (a)-(d). It is required that the material selected be robust enough to withstand an interconnect build by the prior art methods and result in acceptable levels of yield.

It is also preferred that the two IMD layers 1110 and 1120 are identical, although this is not required for the formation of the final structure.

Figure 1A:
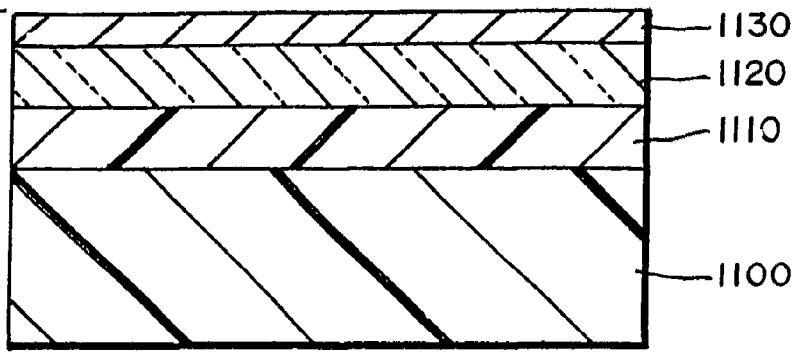
FIGS. 1$a$-1$g$: Dual damascene process flow (prior art)
FIGS. 2$a$-2$h$: Process flow for current invention as found in embodiment 1
FIGS. 3$a$-3$c$: Process flow for embodiment 2
FIGS. 4$a$-4$f$: Illustrations of embodiment 3
Figure 1B:
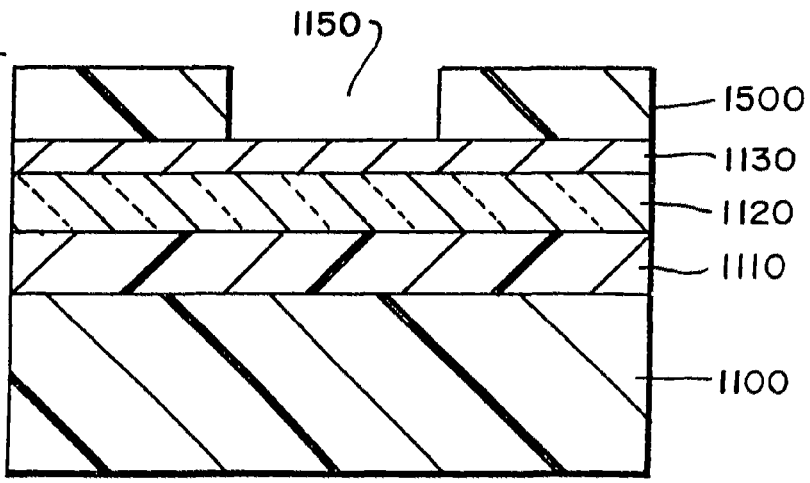
Figure 1C:
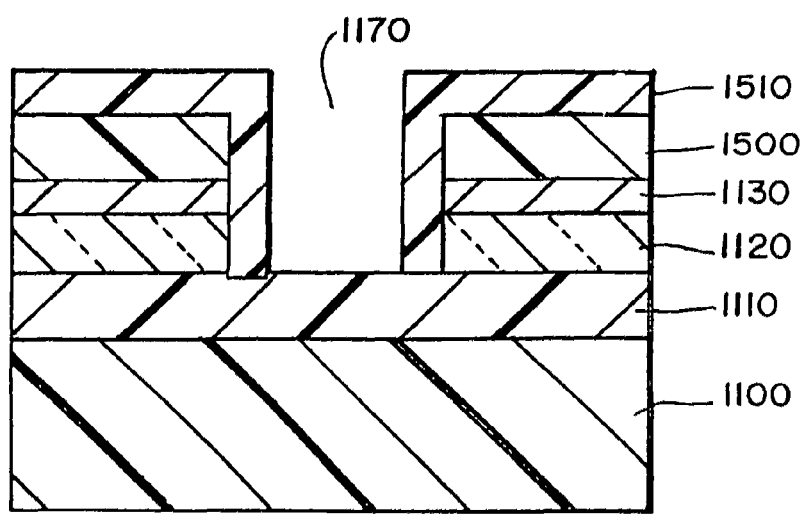
Figure 1D:
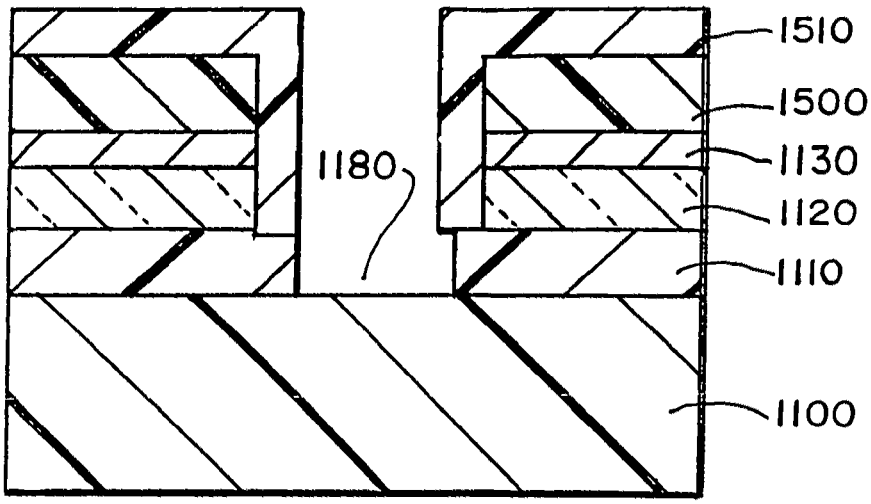
Figure 1E:
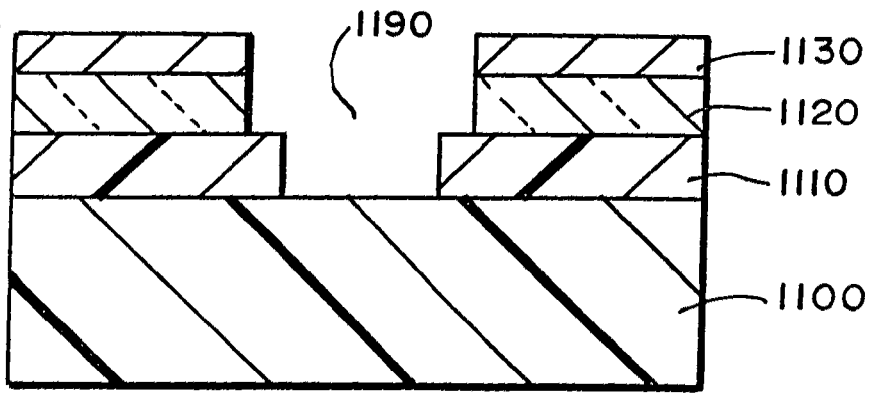
Figure 1F:
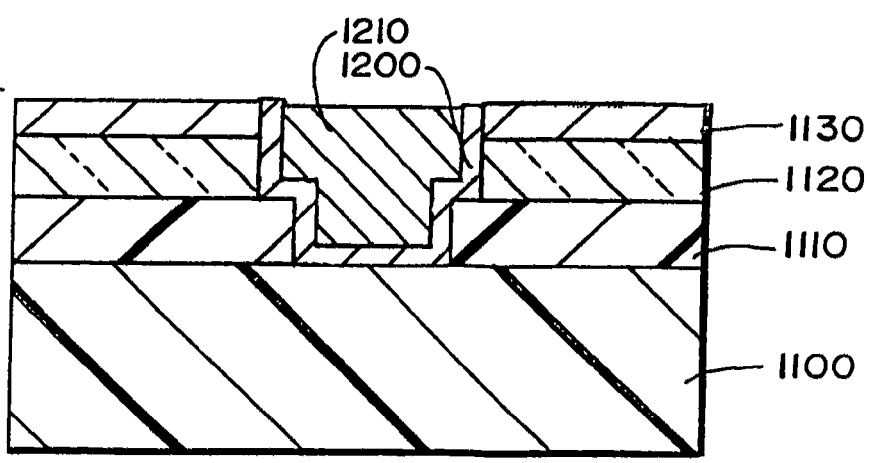

Upon the dual damascene structure prior to cap deposition, shown in FIG. 1f, a two layer structure that consists of a random brush polymer 2100 and diblock copolymer film 2110 is coated and subjected to a thermal cure. The random brush polymer is an oriented layer that covers the surface below and enables the diblock polymer to form a reliable film on top that will phase separate into the regular domains upon curing. As a result of the cure step, the diblock copolymer separates into hexagonal close-packed domains of its constituent blocks. The two phases are represented schematically in FIG. 2a by 2110A and 2110B. Typical thermal cure cycle entails baking at between about 100° C. and about 300° C., preferably about 200° C. for 30 to 60 minutes. In the exemplary case of a polymethylmethacrylate-polystyrene (PMMA-PS) system, the resulting structure consists circular regions of PMMA roughly 12 to 25 nm in diameter located at 30-40 nm centers distributed uniformly in a matrix of PS.

The configuration of the diblock polymer is an essential feature of the present invention. In forming the diblock copolymer used in the present invention, the Flory-Huggins interaction parameter $\chi$ determines the thermodynamics of mixing of two polymers. The parameter $\chi$ is a function of the incompatibility/repulsion of monomers of different species. The extent of segregation of a copolymer is characterized by the product $\chi N$, where N is the copolymer degree of polymerization, i.e., the number of monomer units comprising the polymer. Monodisperse diblock copolymers will spontaneously phase separate at temperatures above their $T_g$ (glass transition temperature), if they have a sufficiently large $\chi N$, which generally means that $\chi N$ 10. As N also determines the dimensions of the resulting microphase separated polymer, it is clear that the spontaneous formation of smaller nanostructures requires a larger compatibility (i.e. larger $\chi$) between polymer blocks.

For example, $\chi$ for polystyrene and polymethyl methacrylate is roughly 0.017 at 200° C., while $\chi$ for polystyrene and polyimide is roughly three times larger (0.046). Based upon these figures, one would expect spontaneous nanostructure formation in the polystyrene/polyimide diblock copolymers at approximately 3 times smaller N in this example.

Other examples of copolymers that may phase separate under the proper process conditions are poly(dimethylsiloxane-b-methylmethacrylate), poly(dimethylsiloxane-b-ethylene oxide), poly(t-butylacrylate-b-vinyl pyridine), poly(isobutylene-b-∈-caprolactam), poly(styrene-b-∈-caprolactam), or any other diblock copolymer that can form a phase-separated pattern.

The diblock film is then "developed" using a solution that preferentially dissolves the one phase to leave a regular array of nanoscale holes 2130 (where PMMA has been dissolved away) in the polymeric matrix 2140. For the poly(MMA-b-S) example, dilute acetic acid selectively dissolved the MMA block. The resulting structure after the aforementioned steps is shown schematically in cross section in FIG. 2b and a top down scanning electron micrograph example of the hexagonal array of holes 2130 now present in the PS matrix 2140 is shown in FIG. 2c.

Figure 2A:
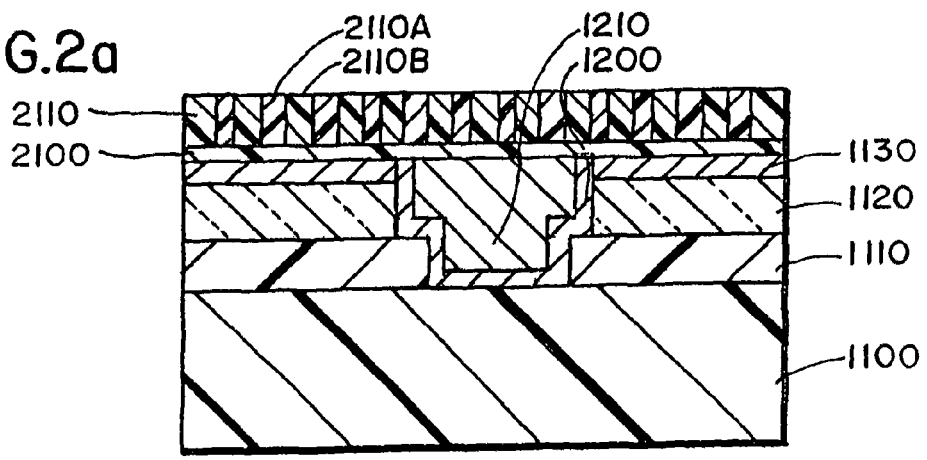
Figure 2B:
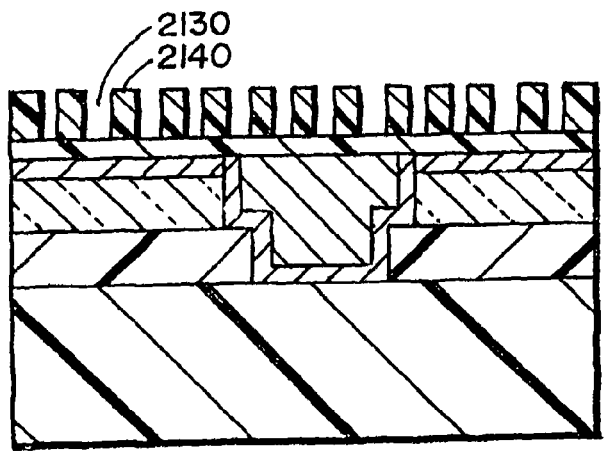
Figure 2C:
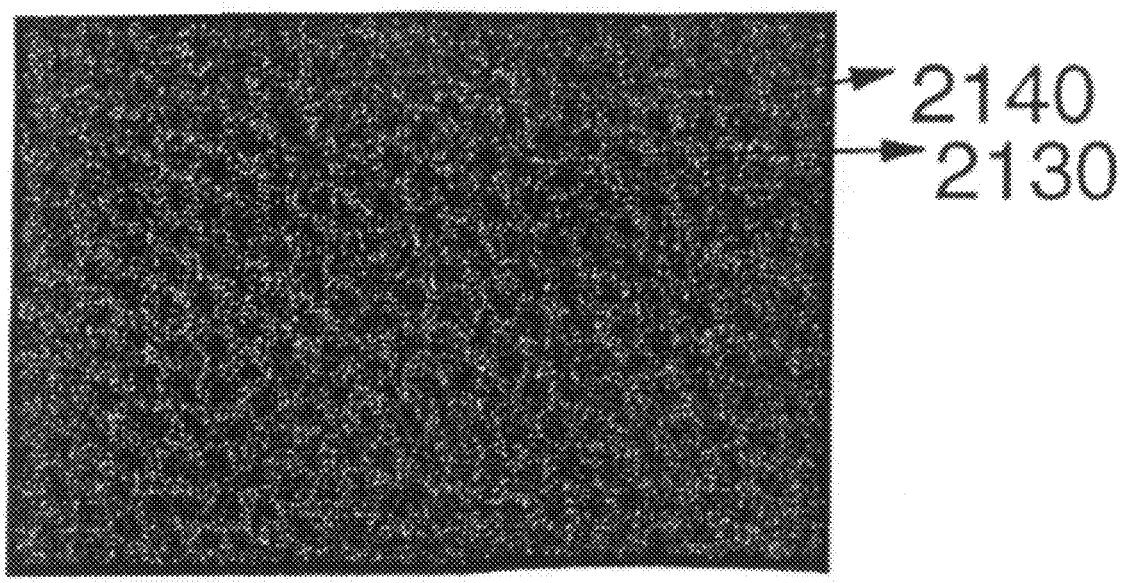
Figure 2D:
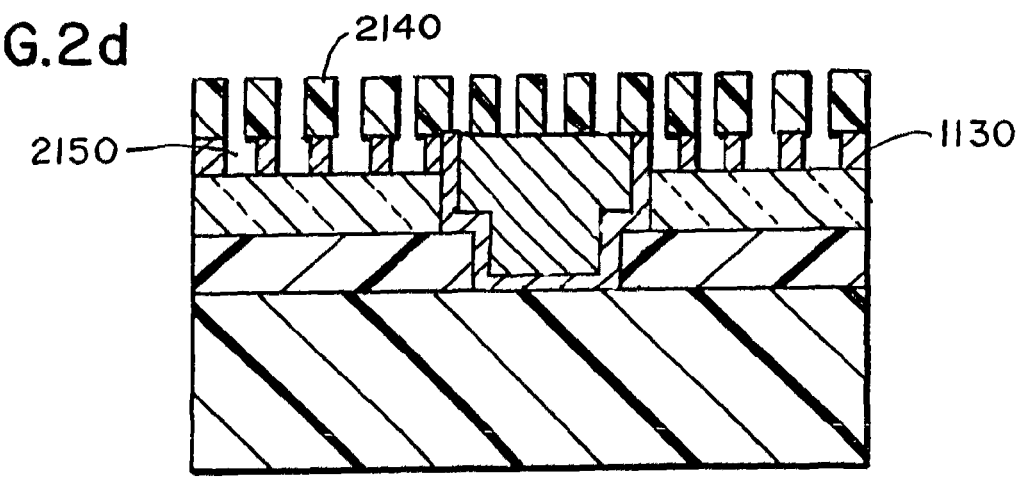

In the next step, hole pattern 2130 is transferred into top layer of the IMD stack 1130 to form a hole array 2150 by using a reactive ion etching (ME) process that selectively etches the hard mask layer 1130 without attacking the polymer matrix 2140, as depicted in FIG. 2d.

Figure 2E:
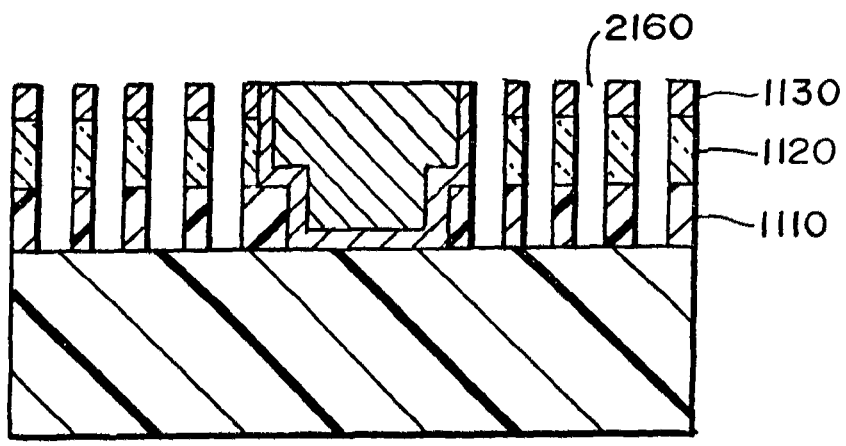

By appropriately changing the RIE process chemistry and conditions, the etched holes 2150 in the hard mask layer 1130 are transferred selectively into the IMD layers 1110 and 1120 resulting in the nanocolumnar porosity structure shown in FIG. 2e, comprising nanocolumnar holes 2160 in the IMD stack 1110, 1120,1130.

Holes 2150 and 2160 are substantially equal in diameter to the holes 2130 in the developed diblock polymer layer. The depth to which the holes 2160 extend into the IMD layers can be varied. It is preferred that the holes extend through IMD layers 1110 and 1120, as shown in FIG. 2e, so that the lower dielectric constant afforded by the nanocolumnar porosity is realized to the maximum.

Figure 2F:
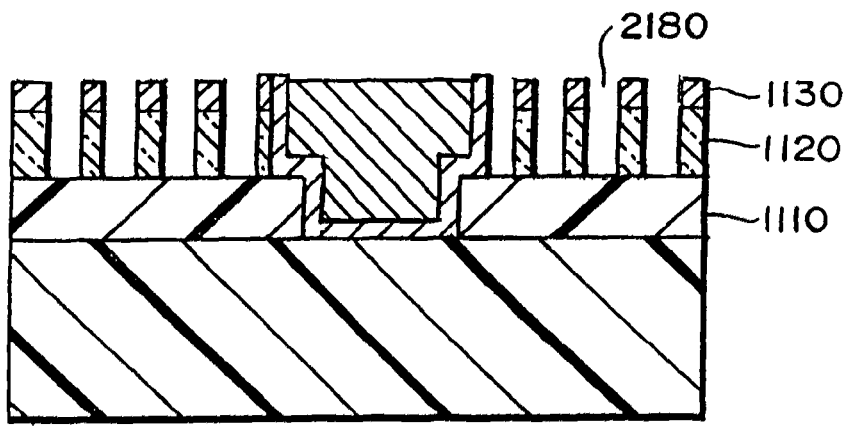
Figure 2G:
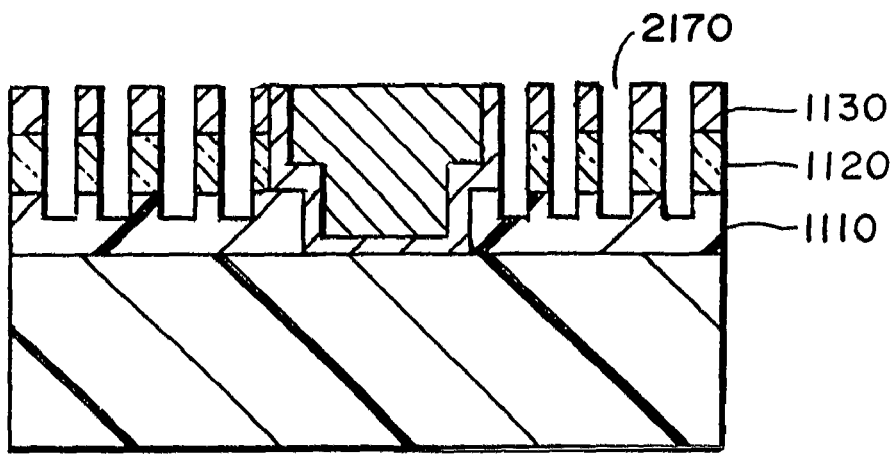

Alternatively, the holes can be etched to extend only into IMD 1110 and stop on 1120 or extend slightly below the interface between the layers 1110 and 1120 as shown in FIGS. 2f and 2g respectively. These structures would lead to a slightly a higher keff but afford higher mechanical strength than the structure depicted in FIG. 2e.

FIGS. 2e-2g are shown with the diblock polymer remnants removed. This is accomplished by a suitable wet or dry etch process known in the prior art on the express condition that the process does not affect the Cu lines or the etched IMD layers. Wet chemical cleans in mild alkaline conditions as those used for photoresist stripping, mild acidic solutions as those used for cleaning oxidized copper surfaces, plasma ashing or combinations thereof can be employed towards this end.

Figure 2H:
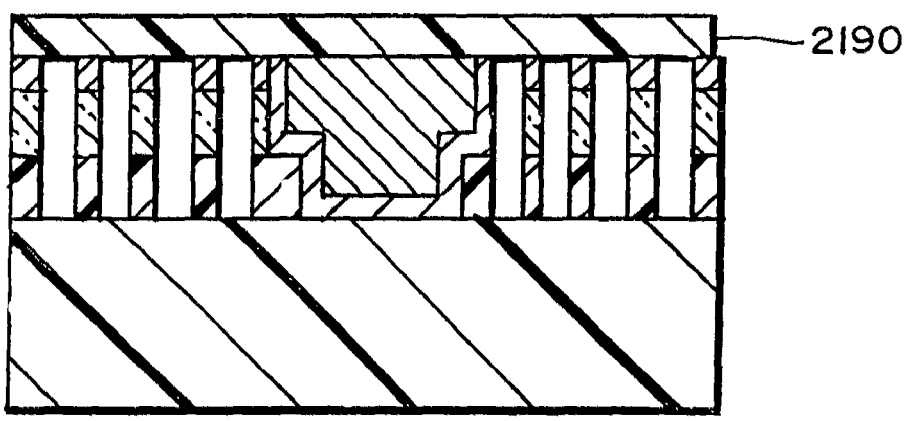

Subsequent to forming the holes 2160, into the ILD as shown in FIG. 2e, respectively, a cap layer 2190 (illustrated for the case after step shown in FIG. 2O is used to pinch off the top of the nanocolumnar porous IMD stack. Hole arrays 2170 and 2180 in FIGS. 2f and 2g would also be capped off prior to further processing in a similar fashion. It is preferred that the dielectric 2190 used for this purpose also act as a copper diffusion barrier since it covers the tops of the metallic lines. Several methods of deposition could be used including but not restricted to PECVD, CVD and spin on coating and curing. Because of the small diameter of the holes, this segment of the process can be adjusted to just penetrate the nanocolumnar holes 2160 (2170, and 2180) enough to close them off without substantially encroaching down into the holes 2160 (2170, and 2180). An optional touch up CMP can be employed to improve planarity after the deposition of the layer 2190. The resulting structure at this juncture is shown in FIG. 2h. Multilevel structures with nanocolumnar IMD can be fabricated by repeating the steps described in FIGS. 2a-2h as required.

In another embodiment (embodiment 2) of this inventive method, illustrated in FIG. 3, the following sequence of steps is additionally performed after the holes 2160 (and holes 2170 and 2180 by analogy) are formed into the IMD and the diblock polymer layer has been etched away.

Figure 3A:
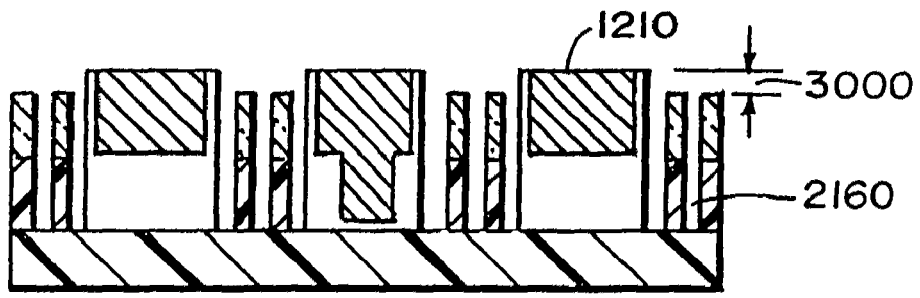

An additional RIE step is performed to etch and recess the IMD layer 1130 and optionally a small depth into layer 1120 so that the etched surface is recessed below the surface of the conductive fill 1210 in the structure as shown in FIG. 3a. This recess 3000 is chosen to be about 10 nm to 60 nm but preferably about 20 nm.

The pinch off dielectric cap 2170 is then deposited such that it pinches off the holes 2160 in the recessed region created above, and covers over the surface of conductive fill 1210.

Figure 3B:
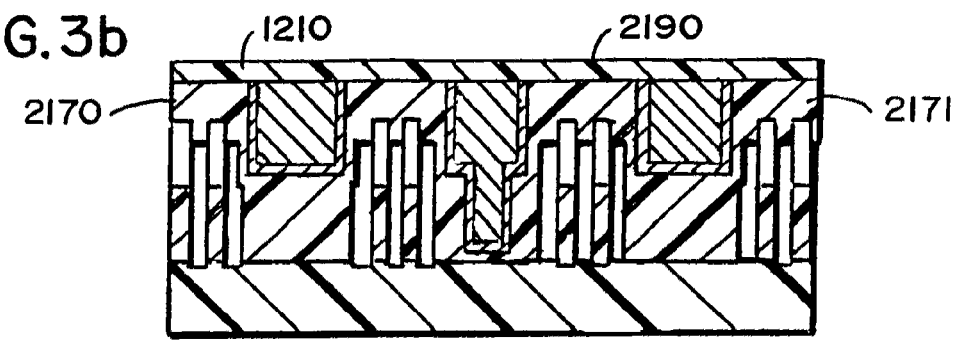

An optional CMP step can be employed to planarize the surface of dielectric cap 2170. The net result of this sequence of steps is to provide a non perforated dielectric region 2171 in gaps between conductive lines 1210 as illustrated in FIG. 3b. A second cap dielectric 2190 is deposited over the entire structure to cover the top surface of regions 2171 and the tops of the conducting lines 1210 as illustrated in FIG. 3b.

Figure 3C:
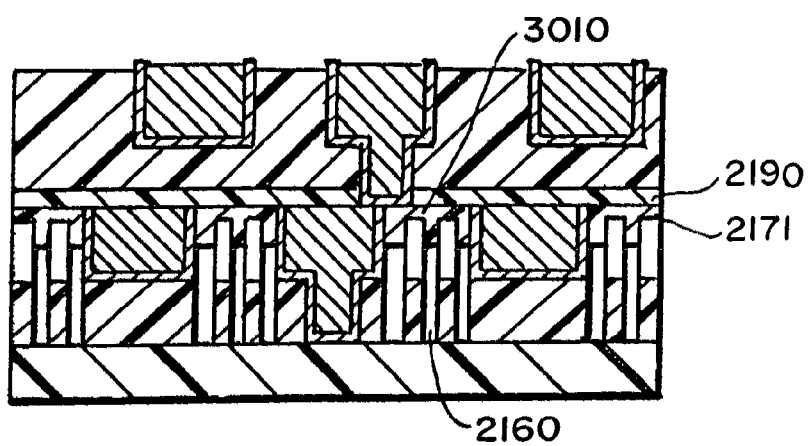

During the subsequent build of the next level of interconnect on top, the cap dielectric layer 2190 over lines 1210 can be etched to provide electrical contact to the top of conductive fill 1210 without any concern regarding the etch through of the nonperforated dielectric region 2171 due to any overlay misalignments 3010 between the levels as shown in FIG. 3c. This is because the nonperforated dielectric 2171 is present in region between the metal lines. Without this procedure, if misalignment between levels leads to etch through of the cap 2190 in the line gaps, metal deposition and plating solutions from the build of the upper level could penetrate into the columnar holes 2160 causing defects, yield loss and reliability concerns. Thus, the added steps provide protection against lithographic misalignment between levels during the build of multilevel interconnects using this inventive method. The steps shown in FIGS. 3a-3c can also be practiced on the more robust nanocolumnar structures illustrated in FIGS. 2e and 2f to derive similar benefits.

Figure 1G:
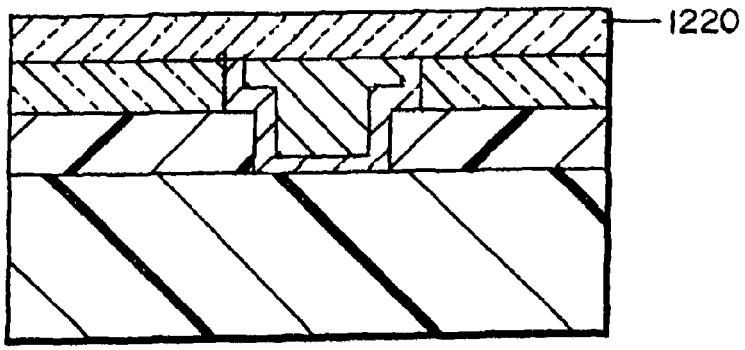
Figure 4A:
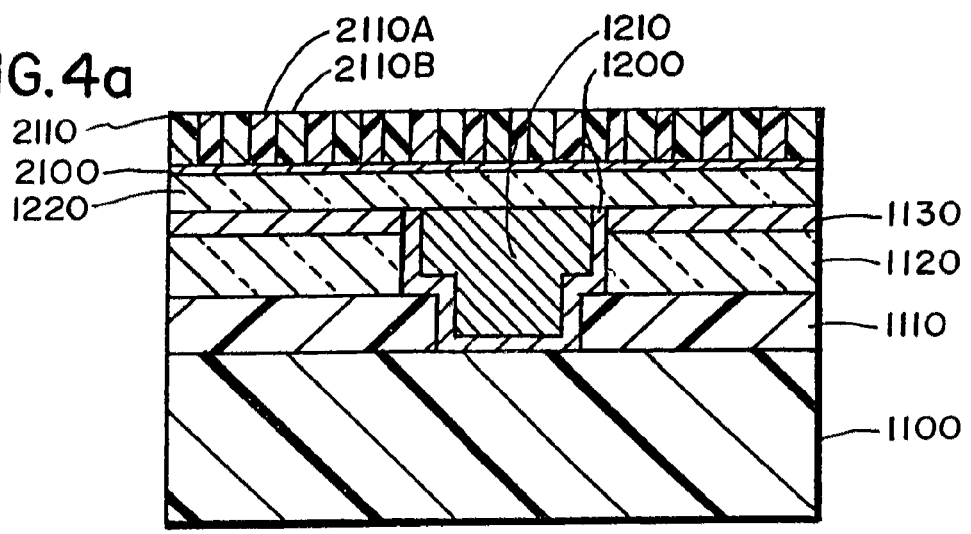
Figure 4B:
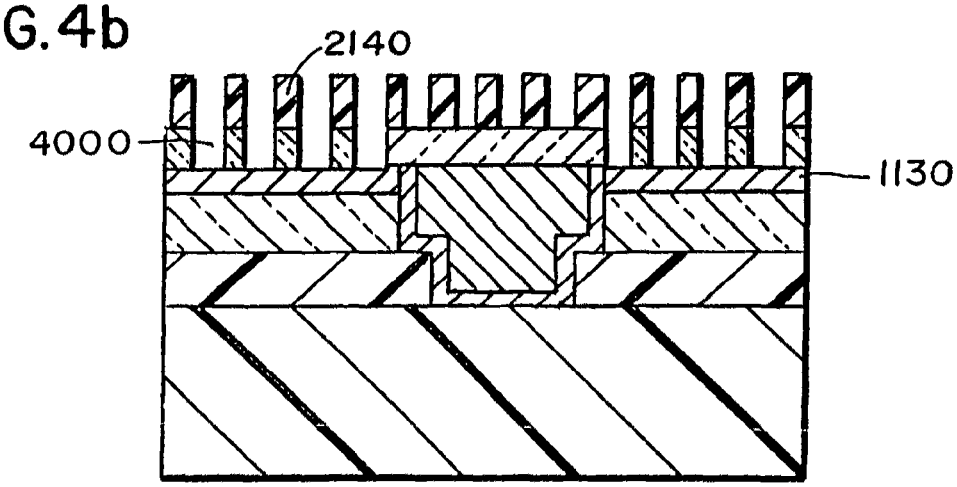
Figure 4C:
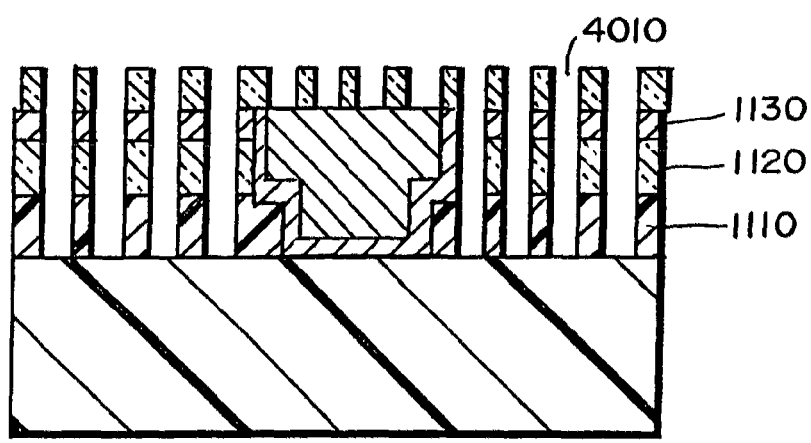

In the third embodiment of the present inventive method, the nanocolumnar diblock stencil film 2110 is generated as described earlier in reference to FIG. 2, except that the structure is generated on a cap layer dielectric 1220 formed on top of the state of the art interconnect structure as exemplified in FIG. 1g. This is shown schematically in FIG. 4a. The remaining matrix 2140 of the stencil is used to transfer the pattern into the cap dielectric layer 1220 resulting in a perforated cap layer dielectric 4000 which rests on the top IMD layer 1130. This transfer process is performed by reactive ion etching. The nanoscale pattern in the perforated cap layer dielectric is then transferred into the IMD stack using the matrix 2140 and patterned cap layer dielectric 4000 as a mask as shown in FIG. 4b. The nanoscale pattern is transferred into the IMD stack 1110, 1120, 1130 generating columnar holes 4010. Analogous structures to those in FIGS. 2f and 2g can also be generated by adjusting the depth of the etch into IMD stack.

Figure 4D:
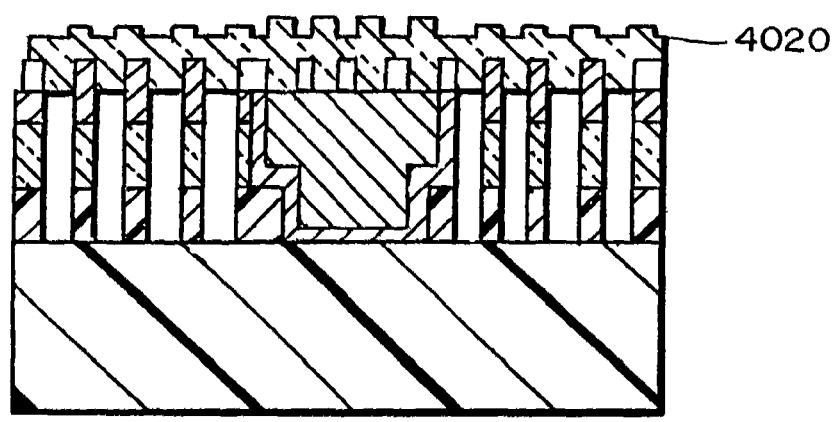
Figure 4E:
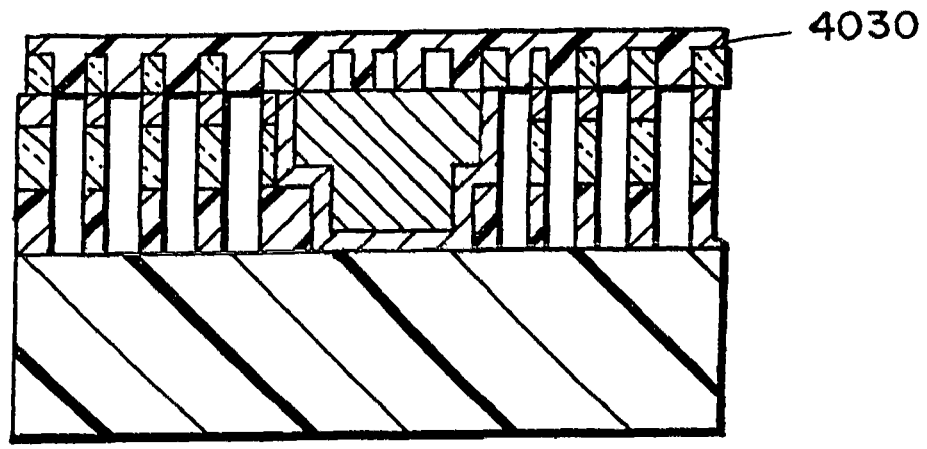
Figure 4F:
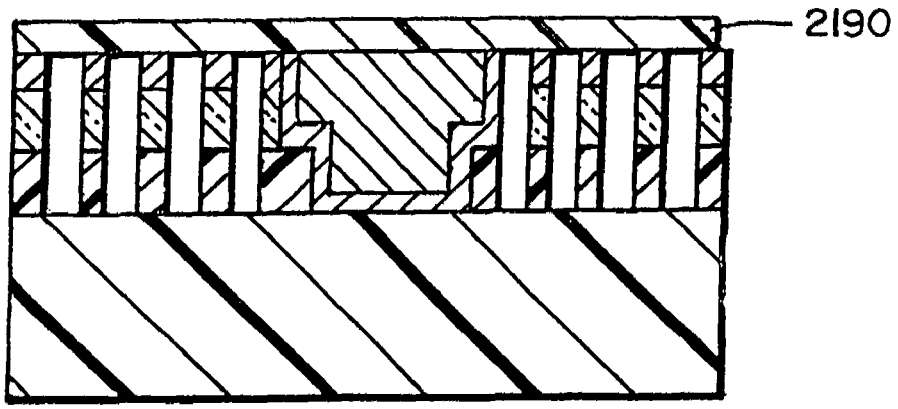

A second cap layer dielectric 4020 is then deposited over the nanocolumnar holes (voids) 4010. Depending on the cap film 4020 used and the process employed for depositing the same, a slight topography may remain as is shown schematically in FIG. 4d. Optionally, layer 4020 may be polished or etched to result in the planarized cap layer 4030. The cap layer dielectrics 1220 and 4020 may be identical or may be different. Since both are in contact with the metal surface, it is preferable that they both are acceptable as Cu Diffusion barriers, and enable good copper electromigration life times.

The cap layer 1220 is selected based on its ability to have a reactive ion etch selectivity to the IMD layers 1110 and 1120 and the hard mask layer 1130, since this cap layer is used to transfer hole patterns into these layers. Additionally it is preferred that the cap layer have a moderately low dielectric constant (5 or less), be a barrier to copper diffusion outwards from the Cu lines and oxygen or moisture diffusion inwards to the lines. By way of example, this cap layer can be selected from the group comprising amorphous hydrogenated PECVD films and spin on dielectrics containing Si and C, hydrogen and optionally O and or N.

Several optional steps can be applied to this third embodiment to generate structures similar to those of FIG. 2 and FIG. 3. As with the process in FIG. 3, the perforated cap layer 4000 may be etched away so that the structure would be identical to that of FIG. 2e. Further, the IMD may be recessed as described in FIG. 3, such that the final structure is identical to the final structure in FIG. 3.

As is evident from the above description, the DD interconnects are fabricated using robust IMD films and a regularly spaced and vertically oriented array of holes with nanometer scale diameter are formed in the IMD after the fact to lower the effective dielectric constant of the structure by between about 15 up to about 70%. The need to handle fragile dielectrics during the DD processing steps is completely avoided. It should be noted that analogous structures with vertical pillars rather than vertical holes may be fabricated using this technique by appropriately selecting the volume fraction and chemistry of the two phases in the diblock polymer system. Additionally other regular arrays of nanoscale patterns may also be produced and used.

Although the invention describes the formation of nanocolumnar IMDs by the exemplary use of diblock copolymer as the template, other templates for forming a regular hole arrays such as using a photoresist patterned by optical lithography, ion beam, x-ray or e-beam lithography; imprinting a hole pattern in a resist using imprint lithography; patterning regular hole arrays on photoresists using diffraction patterns or holography; oblique deposition of a thin dielectric with a nanocolumnar pore structure and the like can be employed without deviating from the spirit of the invention. Essentially, the effective dielectric constant of any single or dual damascene interconnect structure may be improved by applying and transferring vertically oriented nanostructures as taught in the present invention.

Thus, while there have been shown, described and pointed out fundamental novel features of the invention as applied to currently preferred embodiments thereof, it will be understood that various omissions and substitutions and changes in the form and details of the method and compositions illustrated, and in their operation, may be made by those skilled in the art without departing from the spirit of the invention. It is the intention, therefore, to be limited only as indicated by the scope of the claims appended herewith.

What we intend to claim and cover by Letters Patent is:

1. A high performance dual damascene interconnect structure comprising wiring interconnect conductive lines embedded in an intermetal dielectric (IMD) medium having a dielectric constant ($k_{eff}$) between about 1 and 2.2, said dielectric medium having engineered porosity; said network comprising:

a first planar dielectric element encasing a set of conductive vias having a top and a bottom and supporting a set of conductive lines on said top surface of said first dielectric, said first dielectric formed from (a) an organic thermoset dielectric selected from the group consisting of polyimides, polyarylene ethers, benzocyclobutene; (b) a dielectric spun on glass films formed from a substrate selected from the group consisting of tetra ethyl orthosilicate, methyl silsesquioxane, hydrogen silsesquioxane and combinations thereof; (c) hydrogenated amorphous dielectrics comprising silicon, carbon, hydrogen, and oxygen deposited by plasma enhanced chemical vapor deposition (PECVD); (d) undoped silicon oxide glass (USG) and fluorine doped silicon oxide glass (FSG) deposited by PECVD; (e) porous versions of (a) to (d);

a second planar dielectric element formed from the same composition as said first planar dielectric element and disposed between said set of metal conductive lines, said second planar dielectric element having a top surface, a bottom surface and vertical sides, said second planar dielectric element being recessed slightly below a top surface of said set of conductive lines, said set of conductive lines being disposed within said second planar dielectric element, and said second planar dielectric element containing a regular array of nanocolumnar pores, said nanocolumnar pores being positioned between said metal conductive lines in second planar level dielectric and optionally extending through a portion or all of said first planar dielectric element such that the nanocolumnar pores are not present beneath said metal lines in said first planar dielectric element, being closed off at the top by a layer of a third dielectric configured to protect said top surface of the conductive lines, said third dielectric filling said recessed region and covering the top of said conductive lines, and wherein said third dielectric is selected from the group consisting of amorphous hydrogenated silicon carbide, silicon nitride, silicon carbonitride, silicon oxycarbide and combinations thereof;

said conductive lines and said conductive vias comprise a conductive barrier layer selected from the group consisting of titanium, tantalum, tungsten, the nitrides of titanium, tantalum, tungsten, silicon nitrides, carbonitrides, rhenium, rhodium, and combinations thereof and a highly conductive fill selected from the group consisting of copper, gold, aluminum, silver and combinations thereof;

said nanocolumnar pores being substantially parallel to a vertical side of said conductive lines and extending from a top of said conductive lines to either end of said conducting vias;

said formed damascene interconnect structure having nanoscale porosity with controlled size and orientation in said dielectric.

* * * * *